United States Patent [19]

Pham et al.

[11] Patent Number: 5,202,626
[45] Date of Patent: Apr. 13, 1993

[54] ON-CHIP SELF-TEST CIRCUIT

[75] Inventors: Phuc C. Pham, Chandler; Paul B. Sofianos, Mesa, both of Ariz.

[73] Assignee: Motorola, Inc., Schaumburg, Ill.

[21] Appl. No.: 782,955

[22] Filed: Oct. 25, 1991

[51] Int. Cl.$^5$ .............................................. G06F 11/00
[52] U.S. Cl. ................................. 324/158 R; 324/73.1; 371/22.6
[58] Field of Search ................ 324/73.1, 158 R, 78 D, 324/78 Z; 371/15.1, 22.3, 22.4, 22.6, 22.5, 16.1; 307/303.1, 303.2, 351, 352

[56] References Cited

U.S. PATENT DOCUMENTS

| | | | |
|---|---|---|---|
| 4,123,704 | 10/1978 | Johnson | 324/78 D |
| 4,207,791 | 6/1980 | Murakami | 324/78 Z |
| 4,553,109 | 11/1985 | Hyatt | 307/352 |
| 4,724,380 | 2/1988 | Burrows et al. | 324/158 R |
| 5,006,787 | 6/1991 | Katircioglu et al. | 324/73.1 |
| 5,099,196 | 3/1992 | Longwell et al. | 324/73.1 |

Primary Examiner—Vinh Nguyen
Attorney, Agent, or Firm—Bradley J. Botsch, Sr.

[57] ABSTRACT

An on-chip self-test circuit has been provided that allows for accurately testing a device such as prescaler at high frequencies. The on-chip self-test circuit includes a voltage controlled oscillator for providing high frequency signals to the device under test.

The on-chip self-test circuit is rendered active only when one desires to test the device. Thus, when not testing, the on-chip self-test circuit is transparent to the device and consumes substantially zero power.

7 Claims, 2 Drawing Sheets

ON-CHIP SELF-TEST CIRCUIT

FIELD OF THE INVENTION

This invention relates to circuits, for example, an on-chip self-test circuit for a prescaler.

BACKGROUND OF THE INVENTION

Testing and evaluating various devices at high frequencies is typically performed to verify the functionality of the devices. However, such testing and evaluating may become a problem for a number of reasons. First, interfacing an external high frequency signal stimulus at the wafer probe level to a device under test requires expensive and time consuming setup.

Second, the measurement of the stimulus, via a feedback loop, is often erroneous due to the electrical stub presented by the probe needle. As a result, it is difficult to ascertain the actual stimulus amplitude that is applied to the device under test.

Third, since the input impedance for various devices under test can change, the signal stimulus must be compensated for each device wherein this compensation procedure may be time consuming.

Fourth, current technology limits the applied stimulus signal to approximately 1.6 GHz. However, device capabilities have already exceeded 2.6 GHz. Thus, without a better method to test the devices, the high frequency functionality and capability of the devices may never be verified.

Hence, what is needed is an improved method for accurately testing devices at high frequency.

SUMMARY OF THE INVENTION

Briefly, there is provided a test circuit for testing a device, the device having an input and an output, the test circuit comprising a voltage controlled oscillator circuit having an input and an output, the input of the voltage controlled oscillator circuit being coupled to receive a control voltage; and a multiplexer circuit having first, second and select inputs and an output, the first input of the multiplexer circuit being coupled to the output of the voltage controlled oscillator circuit, the second input of the multiplexer circuit being coupled to receive an external signal, the select input of the multiplexer circuit being coupled to receive a select control signal, and the output of the multiplexer circuit being coupled to the input of the device.

The present invention will be better understood from the following detailed description taken in conjunction with the accompanying drawing.

DETAILED DESCRIPTION OF THE DRAWING

Figure 1:
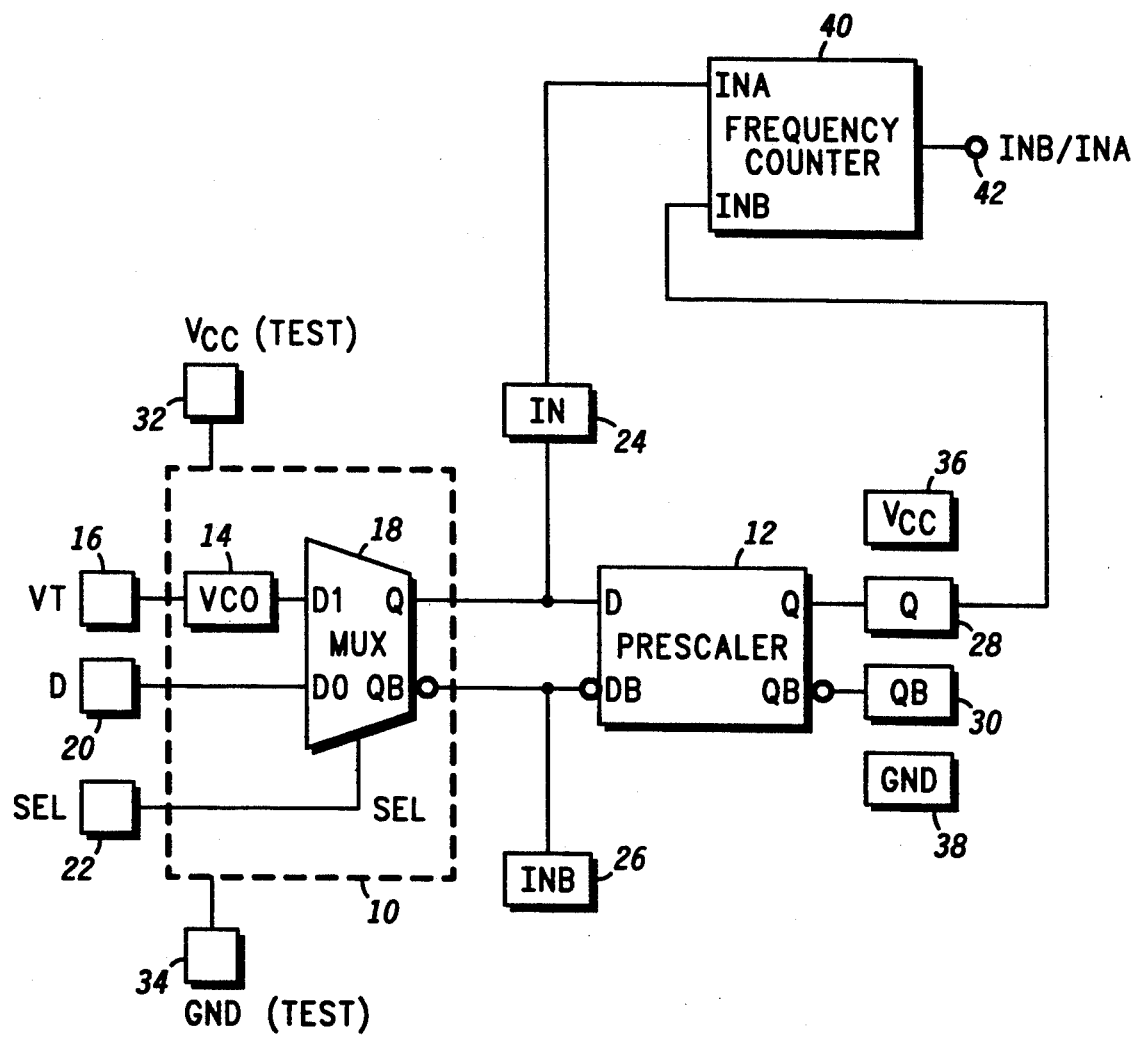
FIG. 1 is a block diagram illustrating an on-chip self-test circuit in accordance with the present invention.

Referring to FIG. 1, a block diagram illustrating on-chip self-test circuit 10 is shown. Self-test circuit 10 is utilized to test a device under test, for example, prescaler 12.

Self-test circuit 10 includes voltage controlled oscillator (VCO) 14 having an input coupled to input pad 16 and an output coupled to a first input of multiplexer 18. The second input of multiplexer 18 is coupled to input pad 20, while the select input of multiplexer 18 is coupled to input pad 22. Multiplexer 18 respectively provides differential outputs to the differential inputs of prescaler 12.

Pads 24 and 26 are utilized both as input pads and output pads. In particular, pads 24 and 26 function as input pads to receive a differential signal that is to be applied to prescaler 12. On the other hand, pads 24 and 26 function as output pads to monitor the differential signal appearing at the output of multiplexer 18.

The differential outputs of prescaler 12 are respectively coupled to output pads 28 and 30.

Power pads 32 and 34 are utilized to power up self-test circuit 10, for example, a positive voltage such as $V_{CC}$ may be applied to power pad 32, while ground reference is applied to power pad 34. It is understood that power pads 32 and 34 are coupled to the respective power supply terminals of VCO 14 and multiplexer 18.

On the other hand, power pads 36 and 38 are utilized to power up prescaler 12 wherein voltage $V_{CC}$ is applied to terminal 36 while ground reference is applied to terminal 38. Likewise, it is understood that power pads 36 and 38 are coupled to the respective power supply terminals of prescaler 12.

Frequency counter 40 has a first input coupled to output pad 24 and a second input coupled to output pad 28. The ratio output of frequency counter 40 is provided at terminal 42.

In normal operation, voltage controlled oscillator 14 of self-test circuit 10 is not powered up such that no voltage levels are applied to power pads 32 and 34. The differential signal applied at pads 24 and 26 is applied to the differential inputs of prescaler 12. Further, prescaler 12 functions to divide the frequency of the signal appearing at its differential inputs by a predetermined factor, for example, N. The prescaled output appearing at the outputs of prescaler 12 is provided at output pads 28 and 30. Thus, it should be realized that under normal operation, pads 24 and 26 function as input pads for receiving an input signal.

However, when it is desired to utilize on-chip self-test circuit 10, VCO 14 and multiplexer 18 are powered up such that predetermined voltages are applied to power pads 32 and 34, for example, voltage $V_{CC}$ being applied to power pad 32 and ground reference being applied to power pad 34.

Further, when a logic high voltage level is applied to the select input of multiplexer 18, multiplexer 18 passes the signal appearing at its first input to its output. In particular, the signal appearing at the output of VCO 14 is passed through multiplexer 18 and subsequently applied to the differential inputs of prescaler 12. Further, as aforedescribed, prescaler 12 functions to divide the frequency of the signal appearing at its differential inputs by a predetermined factor and provides this prescaled signal at output pads 28 and 30.

The frequency of the signal appearing at the output of VCO 14 is controlled by the voltage level applied to pad 16 as is understood. Thus, the frequency of the signal appearing at the output of VCO 14 can be adjusted by varying the voltage applied to pad 16. As a result, prescaler 12 can be tested at high frequencies via the signals generated by VCO 14. Further, in the test mode, the outputs of multiplexer 18 can be monitored via pads 24 and 26. This allows one to know exactly what is being applied to prescaler 12. Thus, it should be realized that during test mode, pads 24 and 26 function as output pads for monitoring the differential output signal of multiplexer 18.

Also during test mode, when a logic low voltage level is applied to the select input of multiplexer 18, multiplexer 18 passes the signal appearing at its second input to its output. In particular, the signal applied to input pad 20 is passed through multiplexer 18 and subsequently applied to the differential inputs of prescaler 12. This allows for the capability of applying an external signal to the input of prescaler 12 even during the test mode.

Frequency counter 40 provides an output at terminal 42 which is a ratio of the frequency of the signal appearing at the non-inverting input of prescaler 12 with respect to the frequency of the signal appearing at the non-inverting output of prescaler 12. As an example to better illustrate the utility of frequency counter 40, if prescaler 12 is set up to divide by N, then the number appearing at output terminal 42 should be substantially equal to N. It is understood that frequency counter 40 is an external component that is utilized to readily verify that prescaler 12 is dividing by the correct number (N).

It should be realized that the additional cost to integrate self-test circuit 10 with prescaler 12 is very small since it only requires adding VCO 14 and multiplexer 18. However, by incorporating self-test circuit 10 with prescaler 12, the ability to accurately test prescaler 12 is substantially enhanced. That is, by including VCO 14 on-chip with prescaler 12, prescaler 12 can be accurately tested at much higher frequencies than typical methods which utilize external equipment.

Further, another advantage of the present invention is that the power dissipation of self-test circuit 10 is substantially equal to zero under normal operation. This is due to the fact that additional power pads 32 and 34 are included to provide separate power to self-test circuit 10. Thus, in normal operation, self-test circuit 10 is transparent to prescaler 12 and any other circuitry (not shown) that may accompany prescaler 12.

Figure 2:
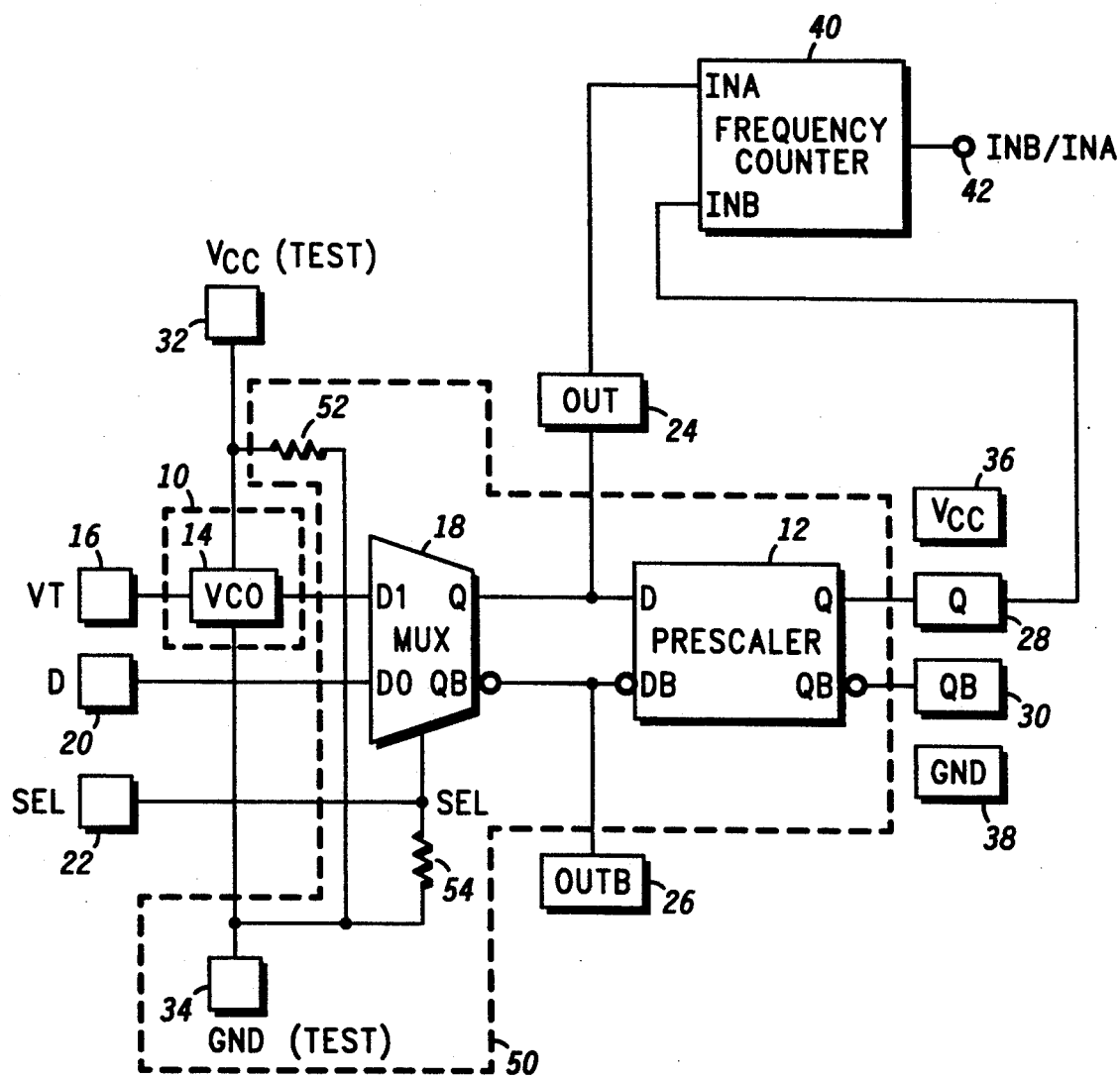
FIG. 2 is a block diagram illustrating an alternate embodiment of an on-chip self-test circuit in accordance with the present invention.

Referring to FIG. 2, a block diagram illustrating an alternate embodiment of an on-chip self-test circuit is shown. It is understood that components shown in FIG. 2 that are similar to components shown in FIG. 1 are identified by the same reference numbers. The alternate embodiment of FIG. 2 makes use of the fact that since most prescalers include input buffers, if the input buffer is replaced by a multiplexer, then on-chip self-test circuit 10 will be reduced to a voltage controlled oscillator.

The circuit shown in FIG. 2 includes "user" prescaler 50 which includes not only prescaler 12 but also multiplexer 18. As a result, self-test on-chip circuit 10 is reduced in circuit complexity to VCO 14. Further, the circuit of FIG. 2 includes one common power pad for ground reference, power pad 34. However, as will be explained hereinafter, self-test circuit 10 of FIG. 2 is also transparent to the rest of the circuitry when no voltage is applied to power pad 32. The circuit of FIG. 2 further includes resistor 52 coupled between power pads 32 and 34, and resistor 54 coupled between power pad 34 and the select input of multiplexer 18.

The operation of the circuit shown in FIG. 2 is similar to the operation aforedescribed for the circuit shown in FIG. 1. However, the input to prescaler 12 is always passed via multiplexer 18. Further, pads 24 and 26 are not utilized as input pads to supply a differential input signal to prescaler 12 when not testing. Rather, pads 24 and 26 are utilized as output pads to observe the differential signal appearing at the input of prescaler 12. Thus, pads 24 and 26 are appropriately labelled OUT and OUTB. In this alternate embodiment, the signal applied to input pad 20 is called the "user" input.

Briefly, in normal operation, voltage controlled oscillator 14 of self-test circuit 10 is not powered up such that no voltage is applied to power pad 32. If input pad 22 is left open, the select input of multiplexer 18 is pulled to a logic low voltage level and the "user" input signal which is applied at pad 20 is passed through multiplexer 18. This allows the signal applied to input pad 20 to appear as a differential signal at the differential input of prescaler 12.

However, when it is desired to utilize on-chip self-test circuit 10 (test operation), VCO 14 is powered up such that a predetermined voltage is applied to power pad 32, for example, voltage $V_{CC}$.

Moreover, during test operation, input pad 22 may be left open thereby forcing a logic low voltage level at the select input of multiplexer 18. This allows multiplexer 18 to pass the signal appearing at input pad 20 to its output (similar to normal operation). But if a logic high voltage level is applied to input pad 22, the select input of multiplexer 18 is forced to a logic high voltage level thereby allowing multiplexer 18 to pass the signal appearing at the output of VCO 14 to its output. This, of course, allows for accurately testing prescaler 12 at high frequencies, as aforedescribed.

One advantage of the circuit of FIG. 2 is that since ground reference power pad 34 is shared between self-test circuit 10 and user prescaler 50, only one additional power pad is required to insure that self-test circuit 10 can be powered-up independently from the rest of the circuit.

Another advantage of the circuit of FIG. 2 is that self-test circuit 10 includes only one element, VCO 14. Thus, the additional circuitry for self-test circuit 10 is very minimal.

By now it should be apparent from the foregoing discussion that a novel on-chip self-test circuit has been provided that allows for accurately testing a device such as prescaler at high frequencies. The on-chip self-test circuit is rendered active only when one desires to test the device. Thus, the on-chip self-test circuit is transparent to the device under normal operation and consumes substantially zero power.

While the invention has been described in conjunction with specific embodiments thereof, it is evident that may alterations, modifications and variations will be apparent to those skilled in the art in the light of the foregoing description. Accordingly, it is intended to embrace all such alterations, modifications and variations in the appended claims.

We claim:

1. A test circuit for testing a device, the device having an input and an output, the test circuit comprising:

a voltage controlled oscillator circuit having an input and an output, said input of said voltage controlled oscillator circuit being coupled to receive a control voltage;

a multiplexer circuit having first, second and select inputs and an output, said first input of said multiplexer circuit being coupled to said output of said voltage controlled oscillator circuit, said second input of said multiplexer circuit being coupled to receive an external signal, said select input of said multiplexer circuit being coupled to receive a select control signal, and said output of said multiplexer circuit being coupled to the input of the device;

independent power supply pads coupled to the test circuit for independently rendering the test circuit operative; and a frequency counter having first and second inputs and an output, said first input of said frequency counter being coupled to said output of said multiplexer circuit, said second input of said frequency counter being coupled to the output of the device, said output of said frequency counter providing an output signal which is a function of the ratio of the frequencies of the signals respectively appearing at the input and the output of the device.

2. An integrated circuit having a self-test circuit, the integrated circuit including a prescaler circuit having an input and an output, the self-test circuit comprising:

a voltage controlled oscillator circuit having an input and an output, said input of said voltage controlled oscillator circuit being coupled to receive a control voltage; and a multiplexer circuit having first, second and select inputs and an output, said first input of said multiplexer circuit being coupled to said output of said voltage controlled oscillator circuit, said second input of said multiplexer circuit being coupled to receive an external signal, said select input of said multiplexer circuit being coupled to receive a select control signal, and said output of said multiplexer circuit being coupled to said input of the prescaler circuit.

3. The integrated circuit according to claim 2 further includes independent power supply pads for independently rendering said voltage controlled oscillator circuit operative.

4. The integrated circuit according to claim 3 further including an external frequency counter having first and second inputs and an output, said first input of said frequency counter being coupled to said output of said multiplexer circuit, said second input of said frequency counter being coupled to the output of said prescaler circuit, said output of said frequency counter providing an output signal which is a function of the ratio of the frequencies of the signals respectively appearing at the input and the output of the prescaler circuit.

5. A circuit, comprising: a device to be tested, the device including a multiplexer circuit and a prescaler circuit, the multiplexer circuit having first, second and select inputs and an output, the prescaler circuit having an input and an output, the second input of the multiplexer circuit being coupled to receive an external signal, the select input of the multiplexer circuit being coupled to receive a select control signal, and the output of the multiplexer circuit being coupled to the input of the prescaler circuit; and a test circuit including a voltage controlled oscillator circuit having an input and an output, said input of said voltage controlled oscillator circuit being coupled to receive a control voltage for adjusting the operating frequency of said voltage controlled oscillator circuit, said output of said voltage controlled oscillator circuit being coupled to the first input of the multiplexer circuit.

6. The circuit according to claim 5 further including independent power supply pads for independently rendering said test circuit operative.

7. The circuit according to claim 6 further including an external frequency counter having first and second inputs and an output, said first input of said frequency counter being coupled to said output of the multiplexer circuit, said second input of said frequency counter being coupled to the output of the prescaler circuit, said output of said frequency counter providing an output signal which is a function of the ratio of the frequencies of the signals respectively appearing at the input and the output of the prescaler circuit.

* * * * *